United States Patent
Noteboom et al.

(10) Patent No.: US 8,054,625 B2
(45) Date of Patent: Nov. 8, 2011

(54) COLD ROW ENCAPSULATION FOR SERVER FARM COOLING SYSTEM

(75) Inventors: Scott Noteboom, San Jose, CA (US); Albert Dell Robison, Placerville, CA (US)

(73) Assignee: Yahoo! Inc., Sunnyvale, CA (US)

( * ) Notice: Subject to any disclaimer, the term of this patent is extended or adjusted under 35 U.S.C. 154(b) by 371 days.

(21) Appl. No.: 12/427,660

(22) Filed: Apr. 21, 2009

(65) Prior Publication Data

US 2010/0263825 A1   Oct. 21, 2010

(51) Int. Cl.
 *H05K 7/20* (2006.01)

(52) U.S. Cl. ............ 361/688; 361/679.47; 361/679.48; 361/679.49; 361/695; 361/696; 165/80.2; 165/104.33; 165/121; 165/122; 62/137; 62/259.2; 454/137; 454/184

(58) Field of Classification Search ............. 361/679.47–679.49, 688, 689, 361/690–697, 717–728; 165/80.2, 80.3, 165/104.19, 104.33, 104.34, 121–122; 454/137, 454/184; 312/223.2, 223.3, 236; 62/59, 62/137, 139, 259.2
See application file for complete search history.

(56) References Cited

U.S. PATENT DOCUMENTS

| | | | |
|---|---|---|---|
| 5,671,805 A | 9/1997 | Ståhl et al. | |
| 6,034,873 A * | 3/2000 | Ståhl et al. | ............ 361/701 |
| 6,131,647 A | 10/2000 | Suzuki et al. | |
| 6,272,955 B1 | 8/2001 | Scemama | |
| 6,305,180 B1 | 10/2001 | Miller et al. | |
| 6,374,627 B1 | 4/2002 | Schumacher | |
| 6,494,050 B2 | 12/2002 | Spinazzola et al. | |
| 6,525,935 B2 | 2/2003 | Casebolt | |
| 6,651,452 B2 | 11/2003 | Lecke et al. | |
| 6,672,955 B2 * | 1/2004 | Charron | ............ 454/184 |
| 6,722,151 B2 | 4/2004 | Spinazzola et al. | |
| 6,854,287 B2 | 2/2005 | Patel | |
| 6,859,366 B2 | 2/2005 | Fink | |
| 6,867,967 B2 | 3/2005 | Mok | |
| 6,886,353 B2 | 5/2005 | Patel | |
| 6,980,433 B2 | 12/2005 | Fink | |
| 7,003,971 B2 | 2/2006 | Kester et al. | |
| 7,046,514 B2 | 5/2006 | Fink et al. | |

(Continued)

FOREIGN PATENT DOCUMENTS

JP    2003-166729    6/2003

(Continued)

OTHER PUBLICATIONS

PCT/US2008/058504, Notification of Transmittal of the International Search Report and the Written Opinion of the International Searching Authority, or the Declaration, Mailed Sep. 23, 2008, 10 pages.

(Continued)

*Primary Examiner* — Michail V Datskovskiy
(74) *Attorney, Agent, or Firm* — Martine Penilla Group, LLP

(57) ABSTRACT

Apparatuses, methods, and systems directed to efficient cooling of data centers. Some embodiments of the invention allow encapsulation of cold rows through an enclosure and allow one or more fans to draw cold air from the cold row encapsulation structure to cool servers installed on the server racks. In other particular embodiments, the systems disclosed can be used to mix outside cool air into the cold row encapsulation structure to cool the servers. In some embodiments, the present invention involves fanless servers installed on the server racks and introduces fan units to draw cooling air from the cold row encapsulation structure through the fanless servers on the racks.

16 Claims, 5 Drawing Sheets

U.S. PATENT DOCUMENTS

| | | | | |
|---|---|---|---|---|
| 7,085,133 | B2 * | 8/2006 | Hall | 361/695 |
| 7,145,772 | B2 * | 12/2006 | Fink | 361/695 |
| 7,165,412 | B1 | 1/2007 | Bean, Jr. | |
| 7,173,820 | B2 | 2/2007 | Fink | |
| 7,259,963 | B2 | 8/2007 | Germagian et al. | |
| 7,266,964 | B2 | 9/2007 | Vogel et al. | |
| 7,278,273 | B1 | 10/2007 | Whitted et al. | |
| 7,325,410 | B1 * | 2/2008 | Bean, Jr. | 62/137 |
| 7,372,695 | B2 * | 5/2008 | Coglitore et al. | 361/679.48 |
| 7,403,391 | B2 | 7/2008 | Germagian | |
| 7,430,118 | B1 | 9/2008 | Noteboom et al. | |
| 7,499,273 | B2 * | 3/2009 | Casebolt | 361/679.48 |
| 7,529,086 | B2 | 5/2009 | Fink | |
| 7,534,167 | B2 | 5/2009 | Day | |
| 7,542,287 | B2 * | 6/2009 | Lewis et al. | 361/695 |
| 7,684,193 | B2 | 3/2010 | Fink | |
| 7,903,407 | B2 * | 3/2011 | Matsushima et al. | 361/695 |
| 7,916,470 | B2 * | 3/2011 | Mills et al. | 361/679.49 |
| 2002/0126449 | A1 | 9/2002 | Casebolt | |
| 2004/0221604 | A1 | 11/2004 | Ota et al. | |
| 2005/0168945 | A1 * | 8/2005 | Coglitore | 361/695 |
| 2006/0260338 | A1 | 11/2006 | VanGilder et al. | |
| 2007/0135032 | A1 * | 6/2007 | Wang | 454/184 |
| 2008/0291626 | A1 * | 11/2008 | Nelson et al. | 361/696 |
| 2008/0305733 | A1 | 12/2008 | Noteboom et al. | |
| 2009/0014397 | A1 * | 1/2009 | Moss et al. | 211/26.2 |
| 2009/0021907 | A1 | 1/2009 | Mann | |
| 2009/0046427 | A1 | 2/2009 | Noteboom et al. | |
| 2009/0168345 | A1 | 7/2009 | Martini | |
| 2009/0255653 | A1 * | 10/2009 | Mills et al. | 165/104.34 |
| 2010/0048119 | A1 | 2/2010 | Tashiro | |
| 2010/0064714 | A1 | 3/2010 | Tashiro | |
| 2010/0091448 | A1 | 4/2010 | Noteboom | |
| 2010/0188816 | A1 * | 7/2010 | Bean et al. | 361/696 |

FOREIGN PATENT DOCUMENTS

| | | |
|---|---|---|
| JP | 2004-319628 | 11/2004 |
| JP | 02006064303 A * | 3/2006 |

OTHER PUBLICATIONS

Xhigemi, "Patent Abstracts of Japan," Publication No. 2004-319628, Published Nov. 11, 2004, 1 page, Printed Oct. 10, 2008.

Masanori et al., "Patent Abstracts of Japan," Publication No. 2003-166729, Published Jun. 13, 2003, 1 page, Printed Oct. 10, 2008.

Noteboom et al., "Cold Row Encapsulation for Server Farm Cooling System," U.S. Appl. No. 11/757,864, 29 pages, filed Jun. 4, 2007.

Noteboom et al., "Cold Row Encapsulation for Server Farm Cooling System," U.S. Appl. No. 12/193,113, 25 pages, filed Aug. 18, 2008.

Noteboom et al., "Cold Row Encapsulation for Server Farm Cooling System," U.S. Appl. No. 12/258,683, 27 pages, filed Oct. 27, 2008.

Noteboom et al., "Cold Row Encapsulation for Server Farm Cooling System," U.S. Appl. No. 12/427,655, 27 pages, filed Apr. 21, 2009.

Noteboom et al., "Cold Row Encapsulation for Server Farm Cooling System," U.S. Appl. No. 12/427,666, 23 pages, filed Apr. 21, 2009.

Noteboom et al., "Cold Row Encapsulation for Server Farm Cooling System," U.S. Appl. No. 12/427,660, 20 pages, filed Apr. 21, 2009.

Office Action for U.S. Appl. No. 12/258,683 date Aug. 5, 2009.

Noteboom et al., "Integrated Building Based Air Handler for Server Farm Cooling System," U.S. Appl. No. 12/500,520, filed Jul. 9, 2009.

Written Opinion for Austrian Patent Application No. 200905275-4 dated Mar. 19, 2010.

* cited by examiner

COLD ROW ENCAPSULATION FOR SERVER FARM COOLING SYSTEM

TECHNICAL FIELD

The present disclosure relates generally to cooling systems for data centers.

BACKGROUND

The rapid growth of Internet services such as Web email, Web search, Web site hosting, and Web video sharing is creating increasingly high demand for computing and storage power from servers in data centers. While the performance of servers is improving, the power consumption of servers is also rising despite efforts in low power design of integrated circuits. For example, one of the most widely used server processors, AMD's Opteron processor, runs at up to 95 watts. Intel's Xeon server processor runs at between 110 and 165 watts. Processors are only part of a server, however; other parts in a server such as storage devices consume additional power.

Servers are typically placed in racks in a data center. There are a variety of physical configurations for racks. A typical rack configuration includes mounting rails to which multiple units of equipment, such as server blades, are mounted and stacked vertically within the rack. One of the most widely used 19-inch rack is a standardized system for mounting equipment such as 1 U or 2 U servers. One rack unit on this type of rack typically is 1.75 inches high and 19 inches wide. A rack-mounted unit (RMU) server that can be installed in one rack unit is commonly designated as a 1 U server. In data centers, a standard rack is usually densely populated with servers, storage devices, switches, and/or telecommunications equipment. In some data centers, fanless RMU servers are used to increase density and to reduce noise.

A data center room should be maintained at acceptable temperatures and humidity for reliable operation of the servers, especially for fanless servers. The power consumption of a rack densely stacked with servers powered by Opteron or Xeon processors may be between 7,000 and 15,000 watts. As a result, server racks can produce very concentrated heat loads. The heat dissipated by the servers in the racks is exhausted to the data center room. The heat collectively generated by densely populated racks can have an adverse effect on the performance and reliability of the equipment in the racks, since they rely on the surrounding air for cooling. Accordingly, heating, ventilation, air conditioning (HAVC) systems are often an important part of the design of an efficient data center.

A typical data center consumes 10 to 40 megawatts of power. The majority of energy consumption is divided between the operation of servers and HVAC systems. HVAC systems have been estimated to account for between 25 to 40 percent of power use in data centers. For a data center that consumes 40 megawatts of power, the HAVC systems may consume 10 to 16 megawatts of power. Significant cost savings can be achieved by utilizing efficient cooling systems and methods that reduce energy use. For example, reducing the power consumption of HVAC systems from 25 percent to 10 percent of power used in data centers translates to a saving of 6 megawatts of power which is enough to power thousands of residential homes.

In a data center room, server racks are typically laid out in rows with alternating cold and hot aisles between them. All servers are installed into the racks to achieve a front-to-back airflow pattern that draws conditioned air in from the cold rows, located in front of the rack, and ejects heat out through the hot rows behind the racks. A raised floor room design is commonly used to accommodate an underfloor air distribution system, where cooled air is supplied through vents in the raised floor along the cold aisles.

An important factor in efficient cooling of data center is to manage the air flow and circulation inside a data center. Computer Room Air Conditioners (CRAC) units supply cold air through floor tiles including vents between the racks. In addition to servers, CRAC units consume significant amounts of power as well. One CRAC unit may have up to three 5 horsepower motors and up to 150 CRAC units may be needed to cool a data center. The CRAC units collectively consume significant amounts of power in a data center. For example, in a data center room with hot and cold row configuration, hot air from the hot rows is moved out of the hot row and circulated to the CRAC units. The CRAC units cool the air. Fans powered by the motors of the CRAC units supply the cooled air to an underfloor plenum defined by the raised sub-floor. The pressure created by driving the cooled air into the underfloor plenum drives the cooled air upwardly through vents in the subfloor, supplying it to the cold aisles where the server racks are facing. To achieve a sufficient air flow rate, hundreds of powerful CRAC units may be installed throughout a typical data center room. However, since CRAC units are generally installed at the corners of the data center room, their ability to efficiently increase air flow rate is negatively impacted. The cost of building a raised floor generally is high and the cooling efficiency generally is low due to inefficient air movement inside the data center room. In addition, the location of the floor vents requires careful planning throughout the design and construction of the data center to prevent short circuiting of supply air. Removing tiles to fix hot spots can cause problems throughout the system.

SUMMARY

The present invention provides systems and methods directed to efficient cooling of data centers where fanless rack mounted servers may be installed. In a particular embodiment, the present invention provides a cold row encapsulation structure comprising at least one server rack port configured to interface with one or more server racks and a cooling module connected to the top surface of the cold row encapsulation structure. The server rack ports are configured to engage the server racks such that a front face of a rack-mounted unit installed in the server racks interfaces with the interior space defined by the cold row encapsulation structure. In some embodiments, server racks ports and server racks are tightly connected by clamps and/or sealing gaskets to reduce air leakage into and out of the cold row encapsulation structure.

Some embodiments of the invention utilize one or more auxiliary fans to draw cold air from the cold row encapsulation structure through the front face of the rack-mounted units in the server racks and to eject hot air from the back side of the rack-mounted units. In some embodiments, the one or more fans may be enclosed in a fan unit and operably attached to the server racks to draw air from the cold row encapsulation structure to cool servers installed on the server racks. Some embodiments of the invention obviate the need for raised subfloors, and the fans and other equipment for forcing cooled air into an underfloor plenum. In addition, some embodiments obviate the need for rack-mounted units, such as servers, disk arrays, and the like, to include internal fans. In other embodiments, the fans of the cooling system can be used as an auxiliary or supplement to the internal fans of the rack-mounted units. The cooling module installed on top of the cold row encapsulation structure cools the hot air through cooling coils installed inside the cooling module. In some embodiments, cold water is used inside the coils to exchange heat with hot air in the cooling module.

In one embodiment of the present invention, the systems and methods are directed to cooling hot air inside the data center server cooling room without introducing outside air. The air is cooled by the water based cooling coils inside the cooling modules and the cooled air enters the cold row encapsulation structure through gravity and the lower pressure created inside the interior space of the cold row encapsulation structure. One or more fans draw cold air through the rack-mounted units in the server racks connected to the cold row encapsulation structure to cool the servers and eject hot air from the back side of the server racks. In some embodiments, the fans are enclosed in a fan unit.

In other embodiments of the present invention, the systems and methods involve mixing outside cool air to cool the servers. In one embodiment, ceiling dampers in a data center may be controlled by a temperature control unit and opened up when the outside temperature reaches certain threshold value. Outside air enters the data center and passes through the cooling module installed on top of the cold row encapsulation structure. One or more fans draw the cold air from the cold row encapsulation structure. Hot air is exhausted to the outside by the ceiling exhaust fans. In some embodiments, to control the moisture in the air in the data center server cooling room, especially when the outside air fails to meet the operating requirements for the servers and other equipment, humidifiers may be used to condition the outside air. In recent years, however, manufacturers of server equipment have significantly relaxed the humidity requirements due to technological advancements.

The following detailed description together with the accompanying drawings will provide a better understanding of the nature and advantages of various embodiments of the present invention.

DESCRIPTION OF EXAMPLE EMBODIMENT(S)

The following example embodiments and their aspects are described and illustrated in conjunction with apparatuses, methods, and systems which are meant to be illustrative examples, not limiting in scope.

Figure 1:
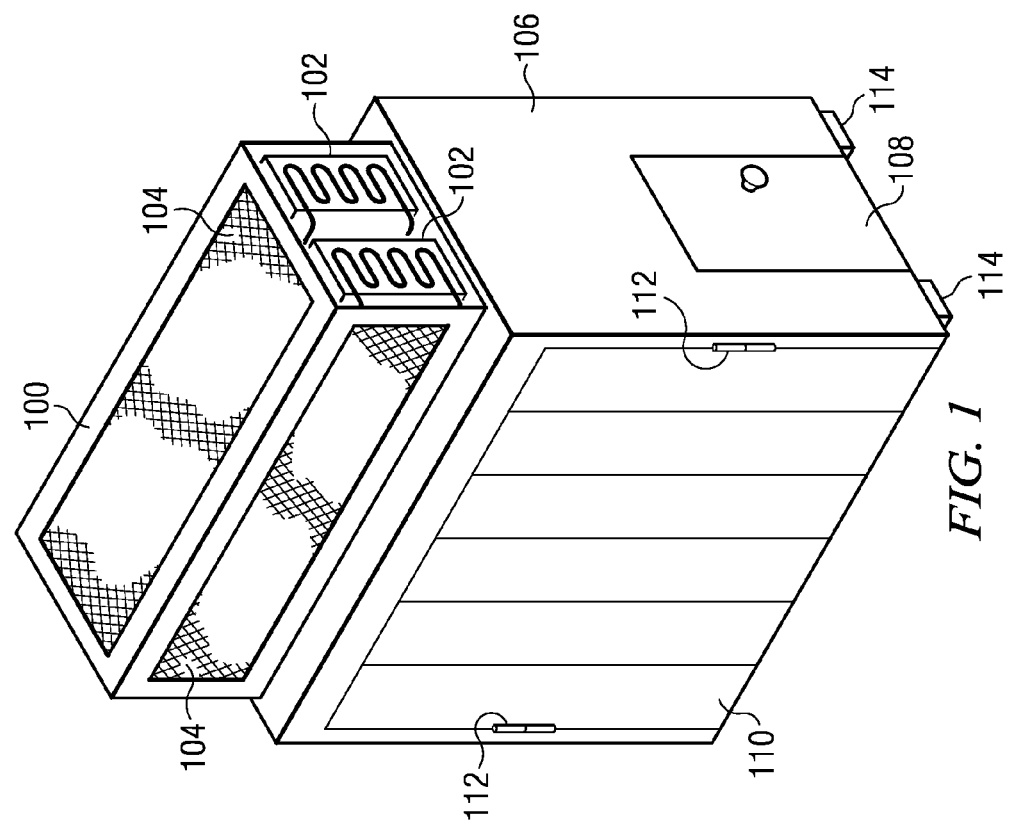
FIG. 1 is a diagram showing an example cold row encapsulation structure and an example cooling module.

FIG. 1 illustrates an example cooling module 100 and an example cold row encapsulation structure 106. The cold row encapsulation structure 106 may have a frame, panels, doors, and server rack ports. A server rack port is an opening on the cold row encapsulation structure 106 that can be connected to a server rack. The cold row encapsulation structure 106 may be made of a variety of materials such as steel, composite materials, or carbon materials that create a housing defining an interior space including at least one server rack port that allows rack mounted unit to interface with the interior space. In some embodiments, the cold row encapsulation structure 106 may be mounted directly to the floor surface and no raised floor is required in a data center cooling room for cooled air.

The cooling module 100 may be located and positioned on top of the cold row encapsulation structure 106 and connected to the top surface of the cold row encapsulation structure 106. The cooling module 100 comprises one or more cooling coils 102. Liquid passing inside the cooling coils 102 is used to exchange heat with relatively hot air passing through the cooling module 100, thereby cooling the air. In one embodiment, the cooling module 100 further comprises an enclosure inside which the cooling coils 102 are located. The cooling module enclosure may have one or more openings 104 through which air enter the enclosure. In some embodiments, the openings 104 may comprise air filters. The cooling module enclosure may have one or more openings connected to the top surface of the cold row encapsulation structure 106, through which openings cold air exits the cooling module and enters the interior space defined by the cold row encapsulation structure.

In some embodiments, water is used inside the cooling coils 102 as heat exchangers. Water pumps, water cooling equipment, and associated plumbing (not illustrated) supplies cooled water to the cooling coils 102. In other embodiments, other types of liquid such as a water-glycol solution, steam, or a refrigerant may be used inside the cooling coils 102 as heat exchangers.

In some embodiments, the cooling coils 102 may be serpentine shaped lines of tubing. In other embodiments, the cooling coils 102 may be in other shapes such as straight lines of tubing. Depending on the size of the cold row encapsulation structure 106, the cooling requirements, the velocity of air flow, and the physical characteristics of the cooling coils 102, the number of cooling coils in the cooling module 100 may vary. In one embodiment, two cooling coils are used inside the cooling module 100.

Since cold air is generally heavier than hot air, the cold air cooled by the cooling coils 102 generally moves downward into the interior space defined by the cold row encapsulation structure 106 which may be located below and connected to the cooling module 100. The cold row encapsulation structure 106 comprises an enclosure which defines an interior space.

The enclosure comprises at least one server rack port 110 configured to interface with a plurality of server racks. The server rack port 110 is configured to interface with the server racks such that a front face of the server racks intersects the interior space of the cold row encapsulation structure 106. In one embodiment, six standard server racks may be connected to the server rack port 110. In another embodiment, twelve standard server racks may be connected to the server rack port 110. In some embodiments, the server racks and the server rack ports 110 may be connected together through one or more clamps 112. In other embodiments, the server racks and the server rack ports 110 may be placed next to each other. In some other embodiments, sealing materials such as gaskets may be used to tightly connect the server rack port 110 and the server racks. The servers are installed into the racks to achieve a front-to-back airflow pattern that draws conditioned air in from the cold row encapsulation structure 106 in the front, and ejects heat out behind the racks.

Figure 4:
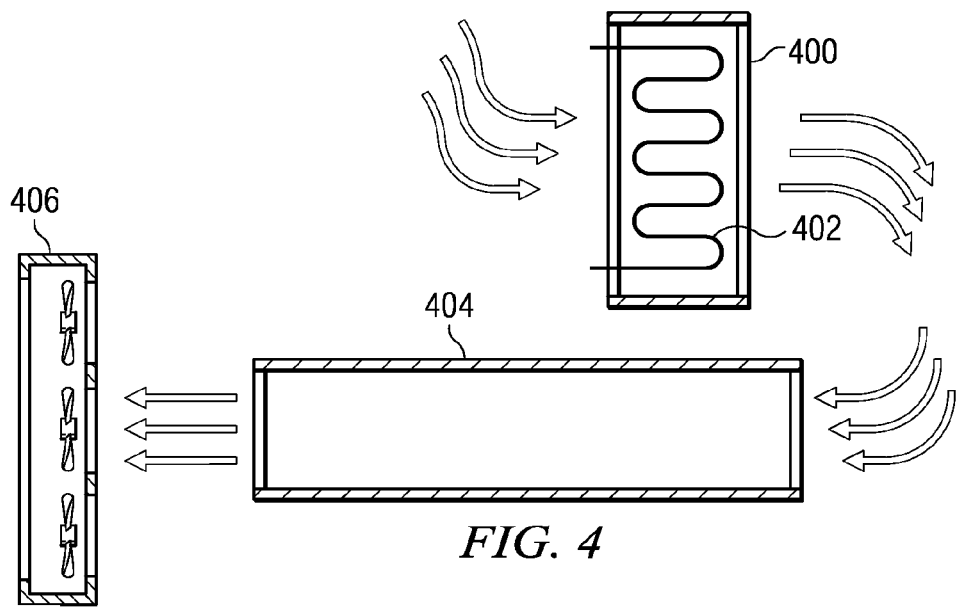
FIG. 4 is a diagram showing an example server and a fan unit that draws cold air conditioned by an example cooling module.

In one embodiment, the cold row encapsulation structure 106 may comprise more than one server rack port 110. A server rack port 110 may engage a server rack such that the front face of servers or other devices installed in the server interface with the interior space defined by the cold row encapsulation structure 106. This configuration achieves a front-to-back airflow pattern, where one or more fans draw air from the interior space and exhaust air heated by the processor(s) and other components out the back panel, as illustrated in FIG. 4. In some embodiments, the server rack and the cold row encapsulation structure may be substantially sealed; conditioned cold air inside the interior space of the cold row encapsulation structure 106 is drawn by one or more fans. In other embodiments, the server rack and the cold row encapsulation structure 106 are placed next to each other so that conditioned cold air inside the interior space of the cold row encapsulation structure 106 can be drawn to the servers by one or more fans. The relatively hot air is circulated to the cooling module 100 on top of the cold row encapsulation structure 106 and exchanges heat with the cooling coils 102. Cold air from the cooling module 100 sinks to the cold row encapsulation structure 106 and is drawn to the back of the servers by one or more fans. In some embodiments, server racks are sparsely populated with servers and other equipment. Since servers and other equipment are stacked vertically within the rack, the scarcity may create open gaps to the interior space of the cold row encapsulation structure. Cold air may leak from the interior space of the cold row encapsulation structure 106, and hot air may circulate back to the interior space, thereby reducing the cooling efficiency. To prevent air leakage, the gaps may be blocked by panels mounted to the server rack that prevent air from escaping and entering the cold row encapsulation structure through the gaps.

In one embodiment, the cold row encapsulation structure 106 may further comprise stability control units 114 on the bottom. The stability control units 114 may comprise components that are built to withstand seismic movements during natural disasters such as earthquakes. In some embodiments, the stability control units 114 may have devices for scrolling that can be quickly released to easily move the cold row encapsulation structure 106. When stability control units 114 are used, the cold row encapsulation structure 106 may be raised from the ground. As a result, cold air may leak and hot air may enter from the bottom side of the cold row encapsulation structure 106. To prevent air leakage, in one embodiment, the bottom side of the cold row encapsulation structure 106 may be enclosed by a panel that seals the bottom surface, on which panel the stability control units 114 may be attached.

In one embodiment, one or more doors 108 may be installed on the enclosure of the cold row encapsulation structure 106. The door 108 may be opened and closed so that data center personnel may enter the cold row encapsulation structure for a variety of tasks such as server maintenance. The door 108 may be insulated to prevent cold air from leaking out of the cold row encapsulation structure 106.

The dimension of the cold row encapsulation structure 106 can vary considerably depending on the desired number of server racks, the cooling requirements of the servers, and the like. In one embodiment, six to twelve standard server racks may be connected to respective server rack ports 110 of the cold row encapsulation structure 106. Another six to twelve standard server racks may be connected to the server rack ports on the opposite side of the cold row encapsulation structure. The distance between the opposing server rack ports may be 4 feet. The height of the cold row encapsulation structure 106 may be 12 feet and the depth may also be 12 feet.

Figure 2:
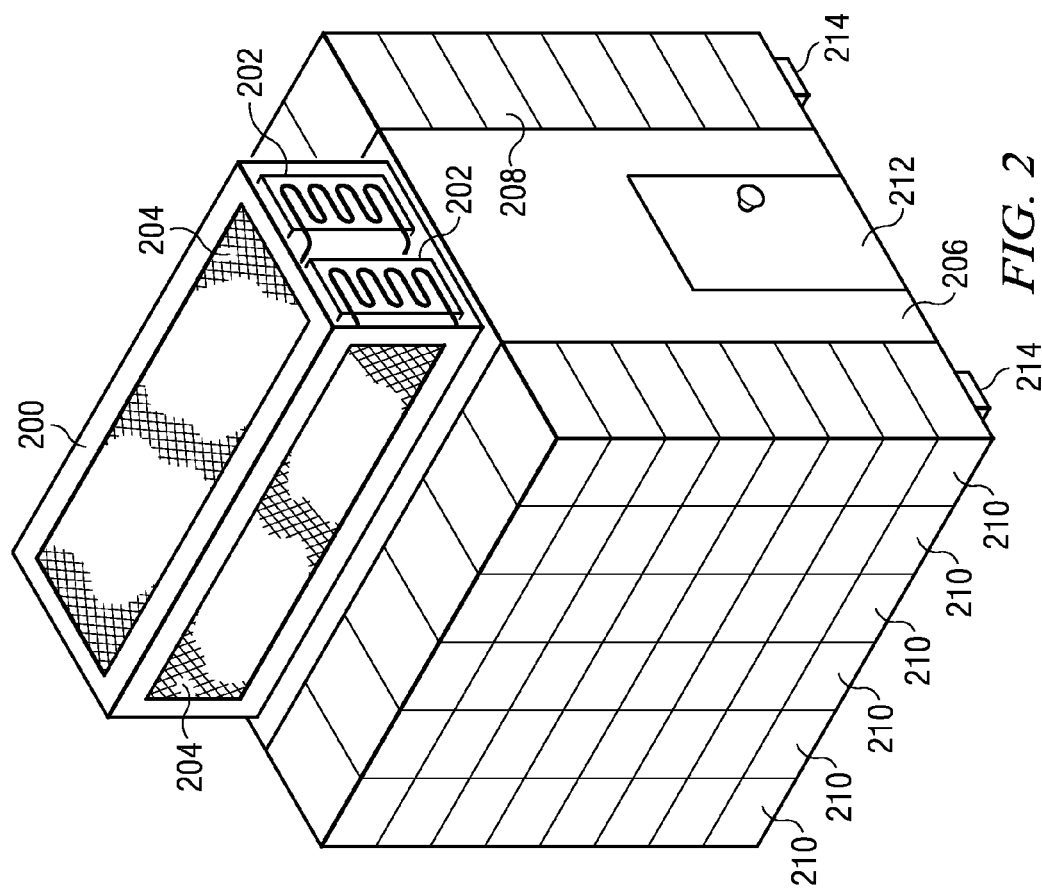
FIG. 2 is a diagram showing an example cold row encapsulation structure with integrated server racks and an example cooling module.

FIG. 2 illustrates an example cooling module 200, a cold row encapsulation structure 206, and integrated server racks 208 and 210. The system in this example is similar to the one shown in FIG. 1 except that the server racks are integral parts of the system. In this embodiment, the connection and sealing between the cold row encapsulation structure 206 and the server racks 208 and 210 are no longer required since the server racks are part of the cold row encapsulation structure 206. The servers may be installed into the integrated server racks 208 and 210 to achieve a front-to-back airflow pattern. The front face of the integrated server racks 208 and 210 intersects the interior space of the cold row encapsulation structure 206. One or more fans draw cold air from the cold row encapsulation structure 206 to cool the servers and blow out relatively hot air from the back of the server racks. Hot air is then circulated to the cooling module 200 through one or more openings 204 and exchanges heat with the one or more cooling coils 202. The cooling module 200 may be located on top of the cold row encapsulation structure 206 and may be connected to the top surface of the cold row encapsulation structure 206 through an opening on the top side of the cold row encapsulation structure 206 and the bottom side the cooling module 200. Cold air generally moves downwards, especially when one or more fans are drawing cold air from the cold row encapsulation structure creating lower air pressure in the interior space of the cold row encapsulation structure 206.

Figure 3:
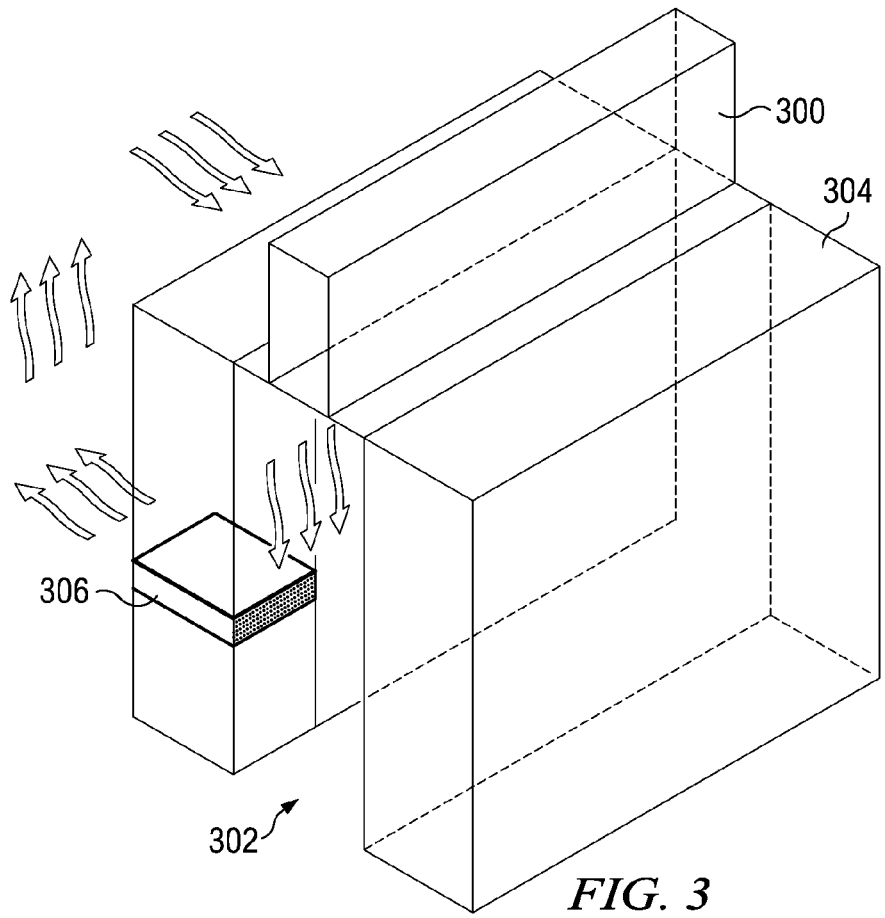
FIG. 3 is a diagram showing an example cold row encapsulation structure with integrated server racks, an example server placed on one of the server racks, and an example cooling module.

FIG. 3 illustrates an example cooling module 300, cold row encapsulation structure 302, server racks 304, and an example server 306 placed on a server rack. The system in this example is similar to the one shown in FIG. 2. Conditioned cold air enters the cold row encapsulation structure 302 through the cooling module 300 placed on top of the cold row encapsulation structure 302. One or more fans draw conditioned cold air from the interior space of the cold row encapsulation structure 302 and cools the server 306.

Figure 6:
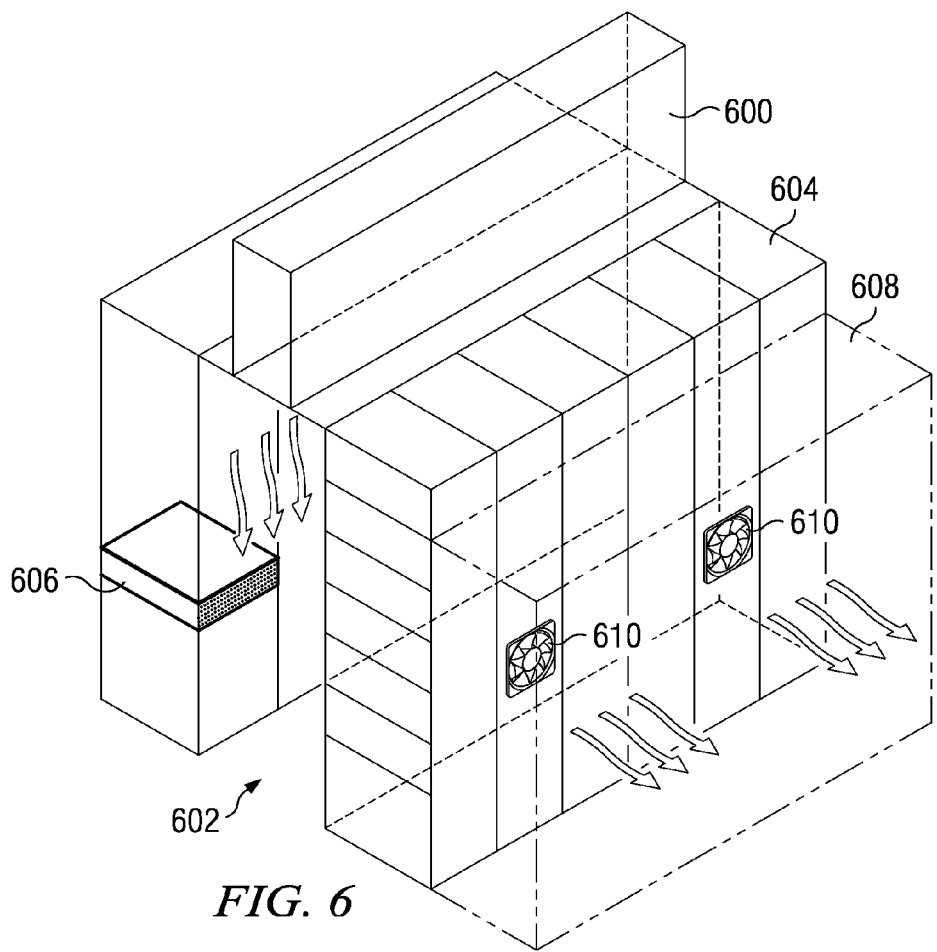
FIG. 6 is a diagram showing an example cold row encapsulation structure, one or more server racks with one or more RMU servers, and a fan unit comprising one or more fans attached to the server racks.

FIG. 4 illustrates an example cooling module 400, cooling coils 402, server 404 and a fan unit 406. Conditioned cold air from the cooling module 400 and cooling coils 402 is drawn by the fan unit 406 and passes through the server 404 to cool the server. In some embodiments, the fan unit 406 comprises one or more fans enclosed in a case made of metal. The fan unit 406 may be attached to the rear face of the server 404. In other embodiments, the fan unit 406 may be connected to the rear face of the server 404 through a tube as illustrated in FIG. 6.

Figure 5:
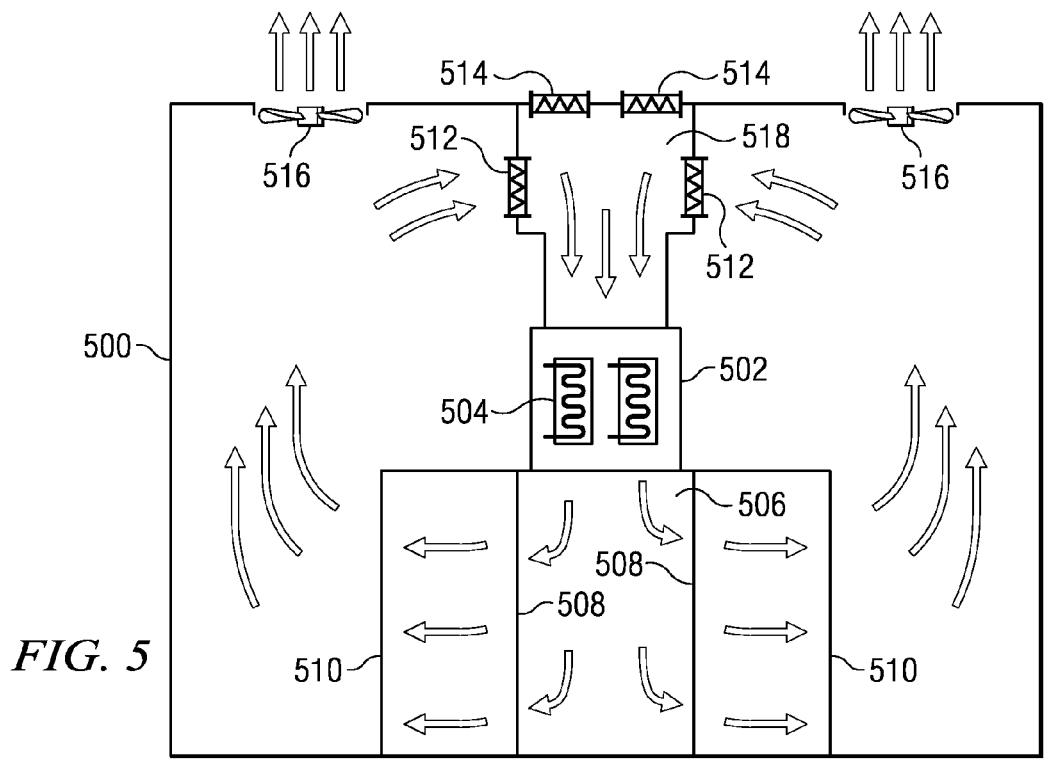
FIG. 5 is a diagram showing an example data center server cooling room with a cold row encapsulation structure, a cooling module, exhaust fans on the roof, and a mixing chamber with dampers that controls the indoor and outdoor air circulation.

The cooling systems illustrated in FIGS. 1 and 2 can operate in an interior space defined by a data center server cooling room, as disclosed above, to draw air from the interior space, and provide cooled air to the interior of the cold row encapsulation structure 106. In some implementations, however, the cooling systems may also operate in connection with a data center cooling room that includes air flow controls that allow outside air to be used. FIG. 5 illustrates an example data center server cooling room 500 with one or more ceiling exhaust fans 516, ceiling dampers 514 which controls outside air intake, a mixing chamber 518, and dampers 512 that control circulation of air entering into the mixing chamber 518. The cooling module 502 comprises one or more cooling coils 504 and is connected to the mixing chamber 518. The top surface of the cold row encapsulation structure 506 is connected to the cooling module 502. Server rack ports 508 on the enclosure of the cold row encapsulation structure 506 are connected to the server racks 510. The servers may be installed into the server racks to achieve a front-to-back airflow pattern. The front face of the server racks intersects the interior space of the cold row encapsulation structure 506. One or more fans draw cold air from the cold row encapsulation structure 506 to cool the servers and eject hot air from the rack-mounted units installed in the server racks. As illustrated in FIG. 6, in some embodiments, the one or more fans may be enclosed in a fan unit and operably attached to the server racks.

The server cooling room 500 may be operated in a variety of modes. In one mode, no outside air is introduced to the server cooling room 500; the hot air ejected from the servers is circulated back to the mixing chamber 518 and the cooling module 502. In another mode, outside cool air is introduced to the server cooling room 500. The ceiling dampers 514 are open while the dampers 512 on the mixing chamber are closed. Outside cool air passes through the cooling module 502 and enters cold row encapsulation structure 506.

In one embodiment, the ceiling dampers 514 are closed and the dampers 512 on the mixing chamber are open. Part of the hot air ejected by the servers is exhausted outside of the server cooling room 500 through the one or more ceiling exhaust fans 516; part of the hot air enters the mixing chamber 518 through the open dampers 512. The hot air inside the mixing chamber is drawn to the cooling module 502 and exchanges heat with the cooling coils 504. Cold air then enters the cold row encapsulation structure 506 through gravity and lower air pressure inside the interior space of the cold row encapsulation structure 506.

In another embodiment, the ceiling dampers 514 are open and the dampers 512 on the mixing chamber are closed. The outside cool air enters the mixing chamber 518 through the open dampers 514, passes through the cooling module 504, and sinks to the interior space of the cold row encapsulation structure 506.

In some embodiments, the opening and closing of the dampers 512 and 514 may be controlled by a temperature control unit. When the outside temperature reaches an appropriate level, the temperature control unit opens up the ceiling dampers 514 to allow outside air to enter the room and closes the dampers 512 on the mixing chamber to prevent hot air ejected from the server from entering the mixing chamber. When the outside temperature is too hot for the server cooling room 500, the temperature control unit closes the ceiling dampers 514 to prevent introducing hot outside air indoors, and opens up the dampers 512 to allow hot air ejected from the servers back to the mixing chamber. Utilizing outside natural cool air significantly reduces energy consumption of data centers, as it reduces the need to cool the liquid circulating through the cooling module 100. In some embodiments, the opening and closing of the dampers 512 and 514, and the operation of the ceiling exhaust fans 516 are all controlled by an electronic device such as a temperature control unit that monitors the temperature inside and outside the server cooling room and operates the dampers and the fans to achieve optimal efficiency in cooling the room.

Depending on the location of the data center, humidity of the outside cool air may vary. When the humidity of the outside cool air is low, the outside air may have to be conditioned so that the humidity level meets the requirement for reliable operation of the servers. Although server manufacturers have significantly relaxed the requirement on humidity for reliable operation of the server equipment, the appropriate humidity of ambient air inside a data center server cooling room still is important to the performance and reliability of the equipment in a data center. In some embodiments, one or more humidifiers may be installed in the mixing chamber 518 to condition the humidity of the air passing through the mixing chamber.

FIG. 6 illustrates an example cooling module 600, cold row encapsulation structure 602, server racks 604, an example fanless RMU server 606 placed on a server rack, and a fan unit 608 operably attached to the server racks. Conditioned cold air enters the cold row encapsulation structure 602 through the cooling module 600 placed on top of the cold row encapsulation structure 602. However, since the RMU servers installed on the server racks 604 comprise no server fans, the fan unit 608 is operably attached to the server racks 604 to draw cooling air from the cold row encapsulation structure 602 to cool the servers installed on the server racks. The fan unit 608 comprises one or more fans. In some embodiments, one or more fans 610 are installed on the face of the fan unit 608 that interfaces with the server racks 604. In some embodiments, the fan unit 608 may be placed next to the server racks 604. In other embodiments, the fan unit 608 may be attached to the server racks 604 by one or more clamps or fasteners. The one or more fans 610 draw conditioned cold air from the interior space of the cold row encapsulation structure 602 and cools the fanless RMU servers installed in the server racks 604. In some embodiments, the rear face of a RMU server may have one or more large air ports to facilitate operation of the fan unit 608, allowing it to draw air through the RMU servers.

Figure 7:
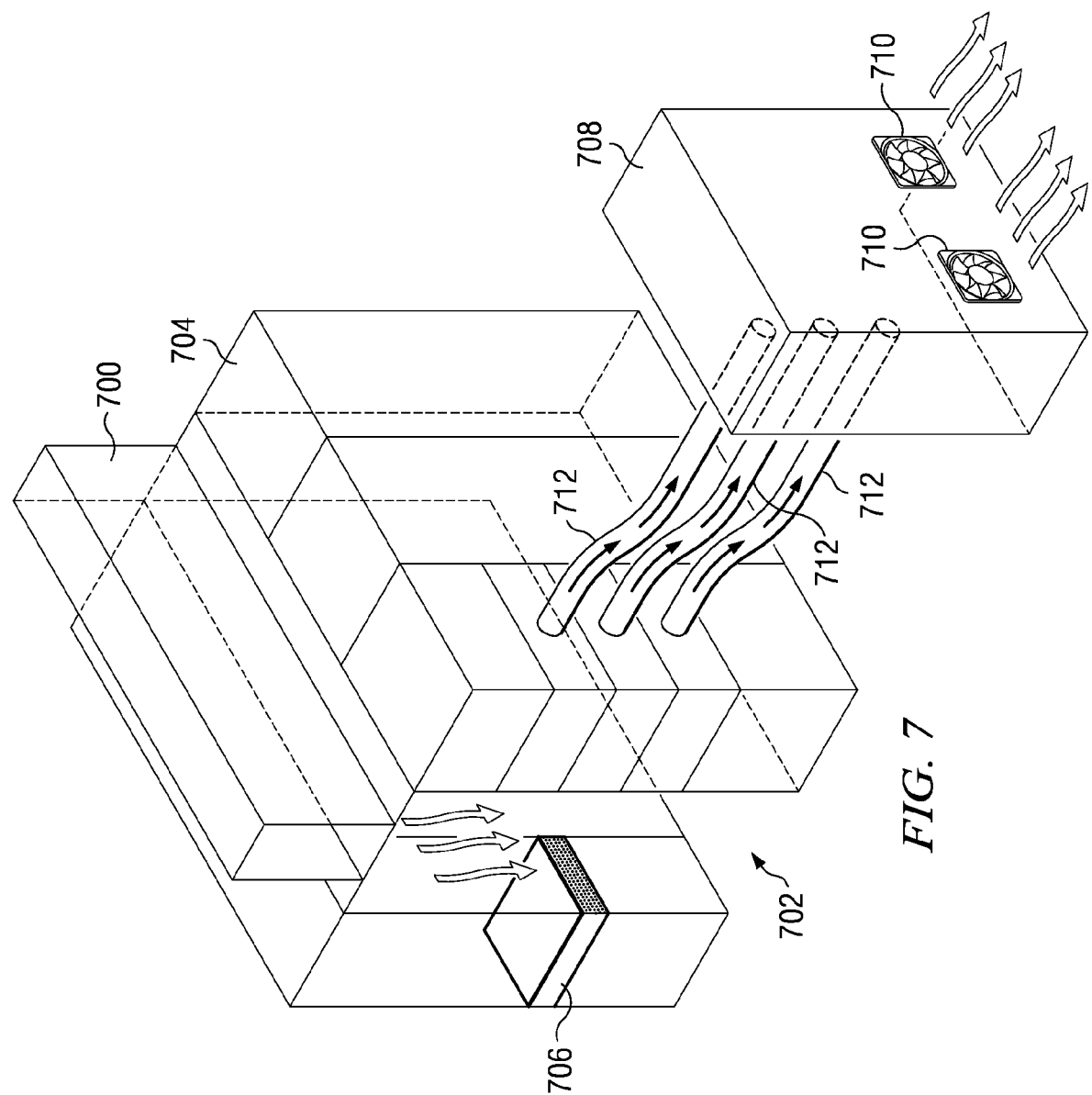
FIG. 7 is a diagram showing an example cold row encapsulation structure, one or more server racks with one or more RMU servers, and a fan unit attached to the server racks through one or more tubes.

FIG. 7 illustrates an example cooling module 700, cold row encapsulation structure 702, server racks 704, an example fanless rack mounted unit (RMU) server 706 placed on a server rack, and a fan unit 708. The system in this example is similar to the one shown in FIG. 6 except that the fan unit 708 comprising one or more fans 710 is connected to the server racks through one or more tubes. In some embodiments, the tubes 712 are made of metal ducts. In other embodiments, the tubes 712 are hoses made of flexible material.

In some embodiments, the tubes 712 are attached to a side (such as a rear face) of one or more of the rack-mounted units installed in the one or more racks 704. In one embodiment, each rear face of a rack-mounted unit includes a port to which a tube 712 can be connected. The one or more fans 710 draw conditioned cold air from the interior space of the cold row encapsulation structure 702 and cool the fanless RMU servers installed in the server racks 704.

Figure 8:
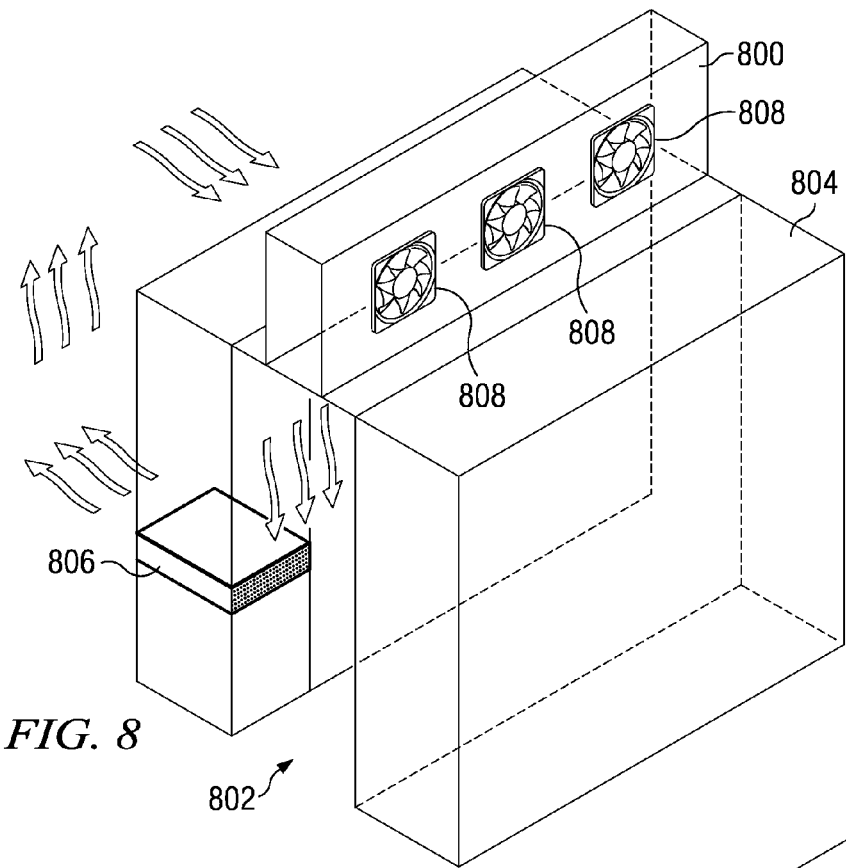
FIG. 8 is a diagram showing an example cold row encapsulation structure, one or more server racks with one or more RMU servers, and one or more fans operably attached to a top face of an enclosure.

FIG. 8 illustrates an example cooling module 800, cold row encapsulation structure 802, server racks 804, and an example fanless rack mounted unit (RMU) server 806 placed on a server rack. The system in this example is similar to the one shown in FIG. 6 except that one or more fans 808 are operably attached to the top face of the row encapsulation structure 802. The fans 808 pushes conditioned cold air from the interior space of the cold row encapsulation structure 802 and cools the fanless RMU servers installed in the server racks 804. In some embodiments, the one or more fans 808 may be enclosed in a fan unit.

Figure 9:
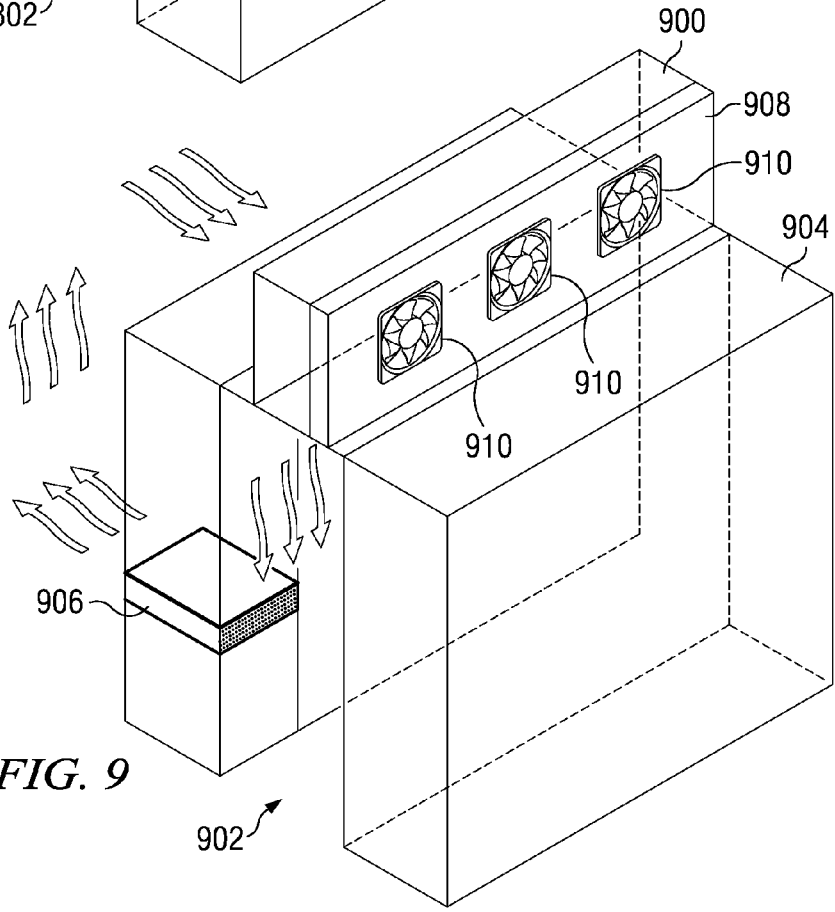
FIG. 9 is a diagram showing an example cold row encapsulation structure, one or more server racks with one or more RMU servers, and one or more fans operably attached to the outside faces of the cold row encapsulation structure.

FIG. 9 illustrates an example cooling module 900, cold row encapsulation structure 902, server racks 904, and an example fanless rack mounted unit (RMU) server 906 placed on a server rack. The system in this example is similar to the one shown in FIG. 6 except that one or more fans 910 are operably attached to one side 908 of the cooling module 900. The fans 910 pushes conditioned cold air from the interior space of the cold row encapsulation structure 902 and cools the fanless RMU servers installed in the server racks 904. In some other embodiments, the one or more fans 910 may be operably attached on both sides of the cooling module 900. In yet other embodiments, the fans 910 may be operably attached to the top face of the cooling module 900.

The present invention has been explained with reference to specific embodiments. For example, while embodiments of the present invention have been described with reference to specific components and configurations, those skilled in the art will appreciate that different combination of components and configurations may also be used. Other embodiments will be evident to those of ordinary skill in the art. It is therefore not intended that the present invention be limited, except as indicated by the appended claims.

What is claimed is:

1. A server cooling system, comprising
an enclosure, wherein the enclosure defines an interior space and comprises a rack port configured to engage a rack;
a cooling and mixing module operative to supply cooling air to the interior space defined by the enclosure;
a rack including one or more fanless rack-mounted units installed therein, wherein the rack is engaged in the server rack port such that respective front faces of the one or more rack-mounted units interface with the interior space defined by the enclosure; and
one or more cooling fans operably attached to respective rear faces of the one or more fanless rack-mounted units to draw air from the interior space through the one or more fanless rack-mounted units.

2. The server cooling system of claim 1 wherein the one or more cooling fans are enclosed in a fan unit.

3. The server cooling system of claim 2 wherein the fan unit is attached to a back face of the rack with which the respective rear faces of the one or more fanless rack-mounted units interface.

4. The server cooling system of claim 2 wherein one or more tubes connect the fan unit with the respective rear faces of the one or more fanless rack-mounted units.

5. The server cooling system of claim 4 wherein each tube comprises one or more hoses.

6. The server cooling system of claim 1 wherein the cooling and mixing module comprises one or more serpentine coils inside which chilled water runs to cool air passes through the cooling and mixing module.

7. The server cooling system of claim 1 wherein the cooling and mixing module supplies the cooling air to the interior space from a top face of the enclosure.

8. The server cooling system of claim 1 wherein each fanless rack-mounted unit comprises a blade computer rack server.

9. The server cooling system of claim 1 wherein the air drew by the one or more cooling fans from the interior space through the one or more fanless rack-mounted units cools the one or more fanless rack-mounted units installed in the rack.

10. A server cooling system, comprising
an enclosure, wherein the enclosure defines an interior space and comprises a rack port configured to engage a rack;
a cooling and mixing module operative to supply cooling air to the interior space defined by the enclosure;
a rack including one or more fanless rack-mounted units installed therein, wherein the rack is engaged in the server rack port such that respective front faces of the one or more rack-mounted units interface with the interior space defined by the enclosure; and
one or more cooling fans operably attached to a top face of the enclosure to push the cooling air into the interior space and out through the one or more fanless rack-mounted units.

11. A server cooling system, comprising
an enclosure, wherein the enclosure defines an interior space and comprises a rack port configured to engage a rack;
a cooling and mixing module operative to supply cooling air to the interior space defined by the enclosure;
a rack including one or more fanless rack-mounted units installed therein, wherein the rack is engaged in the server rack port such that respective front faces of the one or more rack-mounted units interface with the interior space defined by the enclosure; and
one or more cooling fans operably attached to one or more side faces of the cooling and mixing module to push the cooling air into the interior space and out through the one or more fanless rack-mounted units.

12. A server cooling method, comprising
substantially encapsulating an interior space having at least one lateral portion defined by a front face of at least one rack, wherein the at least one rack comprises one or more fanless rack-mounted units installed therein;
introducing a cooling air source to supply cooling air to the defined space; and
operably attaching one or more cooling fans to respective rear faces of the one or more fanless rack-mounted units installed in the at least one rack to draw the cooling air from the defined space through the one or more fanless rack-mounted units.

13. The server cooling method of claim 12, wherein the cooling air source supplies cooling air from a top face of the defined space.

14. The server cooling method of claim 13, wherein the one or more cooling fans are enclosed in a fan unit.

15. The server cooling method of claim 14, wherein one or more tubes connect the fan unit with the respective rear faces of the one or more fanless rack-mounted units.

16. The server cooling method of claim 15, wherein each tube comprises one or more hoses.

* * * * *